(12) United States Patent
Fan et al.

(10) Patent No.: US 7,106,591 B2
(45) Date of Patent: Sep. 12, 2006

(54) LOCKING DEVICE FOR HEAT SINK

(75) Inventors: Chen Lu Fan, Tu-chen (TW); Li-Ping Chen, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 164 days.

(21) Appl. No.: 10/823,063

(22) Filed: Apr. 12, 2004

(65) Prior Publication Data

US 2005/0225946 A1    Oct. 13, 2005

(30) Foreign Application Priority Data

Apr. 11, 2004    (TW) .............................. 92205661 U

(51) Int. Cl.
*H05K 7/20*    (2006.01)

(52) U.S. Cl. ...................... 361/704; 257/718; 257/727; 174/16.3; 165/80.3; 24/296; 24/457

(58) Field of Classification Search ................ 361/704, 361/709; 165/80.3; 257/718, 727; 24/293, 24/457

See application file for complete search history.

(56) References Cited

U.S. PATENT DOCUMENTS

| | | | |
|---|---|---|---|
| 5,386,338 A | 1/1995 | Jordan et al. | |
| 5,428,897 A | 7/1995 | Jordan et al. | |
| 5,448,449 A | 9/1995 | Bright et al. | |
| 5,464,054 A | 11/1995 | Hinshaw et al. | |
| 5,475,564 A | 12/1995 | Chiou | |
| 5,638,258 A * | 6/1997 | Lin | 361/704 |
| 6,621,704 B1 * | 9/2003 | Liu | 361/704 |
| 6,625,021 B1 * | 9/2003 | Lofland et al. | 361/697 |
| 6,782,836 B1 * | 8/2004 | Hales | 112/103 |
| 6,896,046 B1 * | 5/2005 | Lee et al. | 165/185 |
| 6,964,085 B1 * | 11/2005 | Boda | 24/513 |
| 7,019,978 B1 * | 3/2006 | Zhou et al. | 361/704 |
| 2003/0218866 A1 * | 11/2003 | Chen et al. | 361/704 |
| 2005/0111193 A1 * | 5/2005 | Lee et al. | 361/704 |
| 2005/0180114 A1 * | 8/2005 | Zhou et al. | 361/704 |

FOREIGN PATENT DOCUMENTS

| | | |
|---|---|---|
| TW | 281315 | 7/1996 |
| TW | 491491 | 6/2002 |

* cited by examiner

*Primary Examiner*—Boris Chervinsky
(74) *Attorney, Agent, or Firm*—Wei Te Chung

(57) ABSTRACT

A locking device, for locking a heat sink (30) to a socket (10) on which an electronic component (20) is mounted, includes a pair of clips (60) each having a handle (62) and a ring (66). The handle includes a pair of first tabs (68) at one end thereof. A pivot (64) is connected between the first tabs and received in a slot (40) defined in an outmost fin of the heat sink. The handle further includes a pair of second tabs (72). The ring includes an opening end and a closed end for engaging with the socket. The opening end includes a pair of pivot portions extending through the second tabs. The handles are pivotable about the corresponding outmost fins between first positions at which the closed end of the rings are engaged with the socket and second positions at which the closed end are disengaged from the socket.

13 Claims, 3 Drawing Sheets

LOCKING DEVICE FOR HEAT SINK

BACKGROUND OF THE INVENTION

1. Field of the Invention

The present invention relates to a locking device, and particularly to a locking device for conveniently locking a heat sink to an electronic device.

2. Related Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the generated heat quickly, for example by using a heat sink attached to the CPU in the enclosure. This allows the CPU and other electronic components in the enclosure to function within their normal operating temperature ranges, thereby assuring the quality of data management, storage and transfer. Oftentimes, a clip is required for mounting the heat sink to the CPU.

A wide variety of heat dissipating devices and clips are available in the prior art. For example, Taiwan Patent Application No. 90201183 discloses a kind of conventional clip for locking a heat sink to a socket on which a CPU is mounted. The clip comprises a spring pressing portion extending through a wide channel of the heat sink and a pair of legs depending from opposite ends of the pressing portion. Each leg defines a locking opening which can engage with a corresponding retaining block of the socket by using a tool to operating on the leg. However, it is complicated to use the tool. Furthermore, the wide channel takes up space that would otherwise be utilized to provide more fins for the heat sink. In effect, the clip reduces a heat dissipating area of the heat sink, and reduces the heat dissipating capability of the heat sink. Moreover, the spring pressing portion of the clip in the heat sink will baffle air flow from a fan mounted on the heat sink, thereby reducing the heat dissipating efficiency of the heat sink.

SUMMARY OF THE INVENTION

Accordingly, an object of the present invention is to provide a locking device which can conveniently secure a heat sink to an electronic device.

Another object of the present invention is to provide a locking device for a heat sink which allows a heat dissipating area of the heat sink to be maximized.

To achieve the above-mentioned objects, a locking device in accordance with a preferred embodiment of the present invention comprises a pair of clips each having a handle and a ring. The handle comprises a pair of first tabs inwardly formed at one end thereof. The first tabs define a pair of first coaxial holes. A pivot extends through the first holes of the first tabs and is received in a slot defined in an outmost fin of a heat sink thereby pivotably attaching the handle to the heat sink. The handle further comprises a pair of second tabs outwardly formed therefrom adjacent to the first tabs. The second tabs defines a pair of second coaxial holes. The ring is made by bending a wire to form an approximate rectangular shape. The ring comprises an opening end and a closed end for engaging with a socket on which the heat sink is located. A pair of pivot portions is formed at the opening end and extends through the second holes thereby connecting the ring to the handle. The handles are pivotable about the corresponding outmost fins between first positions at which the rings are engaged with the socket and second positions at which the rings are disengaged from the socket.

Other objects, advantages and novel features of the present invention will be drawn from the following detailed description of a preferred embodiment of the present invention with attached drawings, in which:

DETAILED DESCRIPTION OF THE INVENTION

Figure 1:
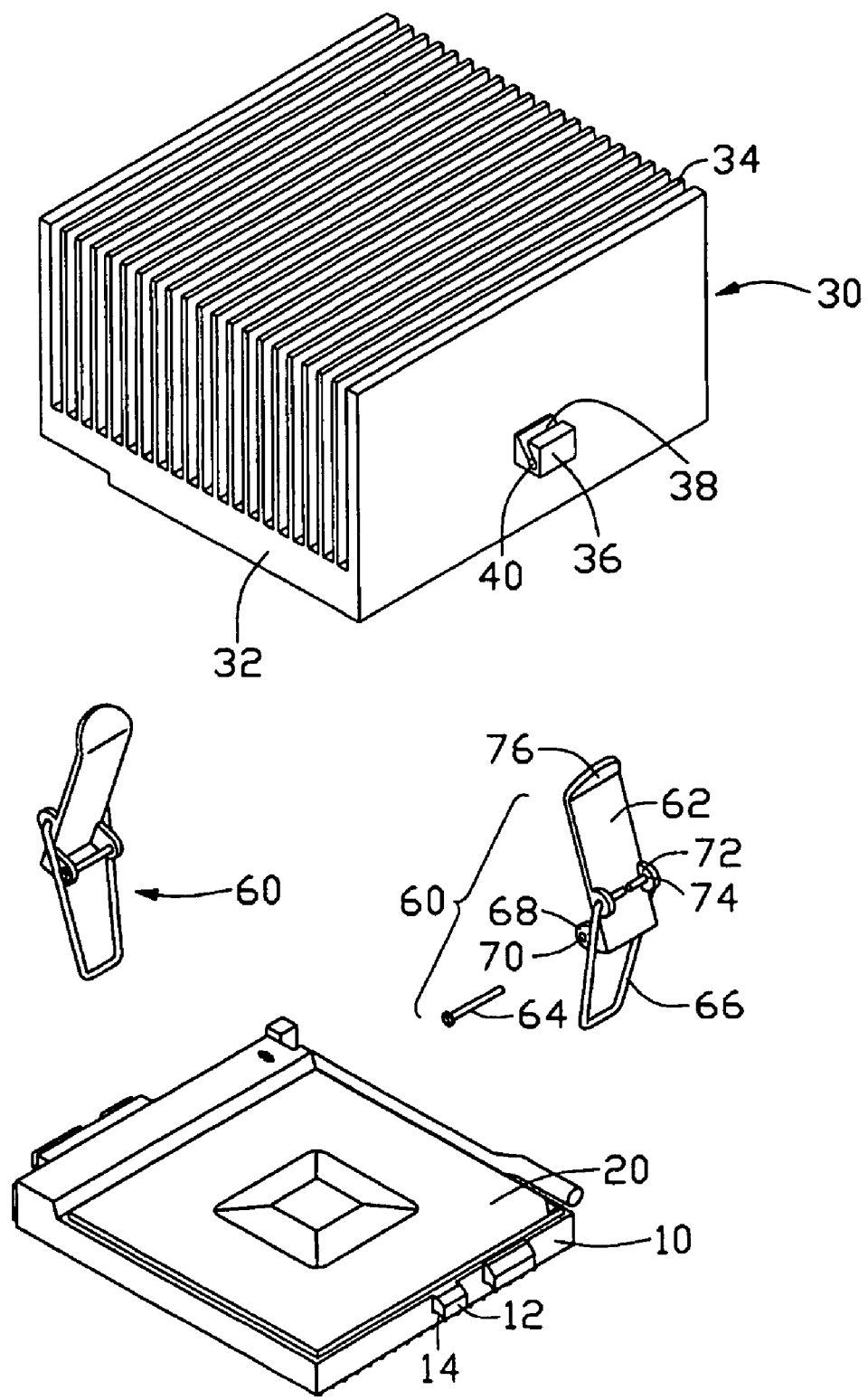
FIG. 1 shows a locking device in accordance with the preferred embodiment of the present invention for mounting a heat sink to a socket on which an electronic component is mounted.

FIG. 1 shows a locking device in accordance with a preferred embodiment of the present invention, for locking a heat sink 30 to a socket 10 on which an electronic component 20 is mounted. The socket 10 comprises a pair of locking blocks 12 formed on opposite sides thereof. Each locking block 12 comprises a concave bottom surface 14.

The heat sink 30 comprises a base 32 and a plurality of spaced parallel fins 34 extending upwardly from the base 32. Each outmost fin 34 comprises a protrusion 36 formed on an outer surface thereof. Each protrusion 36 defines a guiding entrance 38 from a top surface thereof. A pivot slot 40 is defined in the protrusion 36 in communication with and below the guiding entrance 38.

One clip 60 will be described in detail since both are identical in construction, function and operation. The clip 60 comprises a handle 62, a shaft 64, and a locking ring 66. The handle 62 comprises a pair of first tabs 68 inwardly formed on opposite side of one end portion thereof. The first tabs 68 define a pair of first coaxial holes 70. The shaft 64 extends through the first coaxial holes 70. A pair of second tabs 72 is formed outwardly on opposite sides of the handle 62 adjacent to the first tabs 68. The second tabs 72 define a pair of second coaxial holes 74. An operating portion 76 is formed at an opposite end of the handle 62 by bending the opposite end outwardly. The locking ring 66 is made by bending a wire to form an approximate rectangular structure. The approximate rectangular structure comprises an opening end and a close end. The locking ring 66 comprises a pair of pivot portions formed at the opening end thereof. The pivot portions of the locking ring 66 extend through the respective second holes 74 of the second tabs 72.

Figure 2:
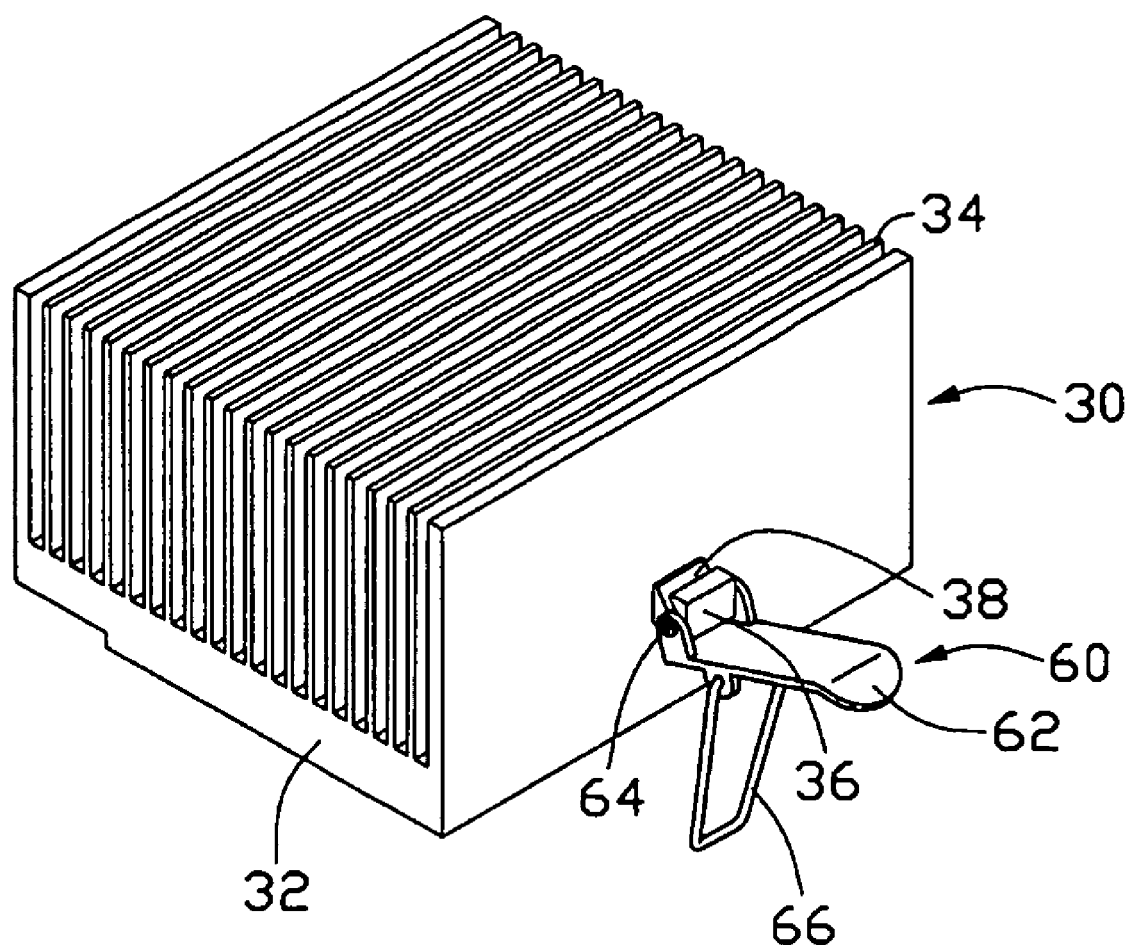
FIG. 2 is an assembled view of the locking device and the heat sink of FIG. 1.
Figure 3:
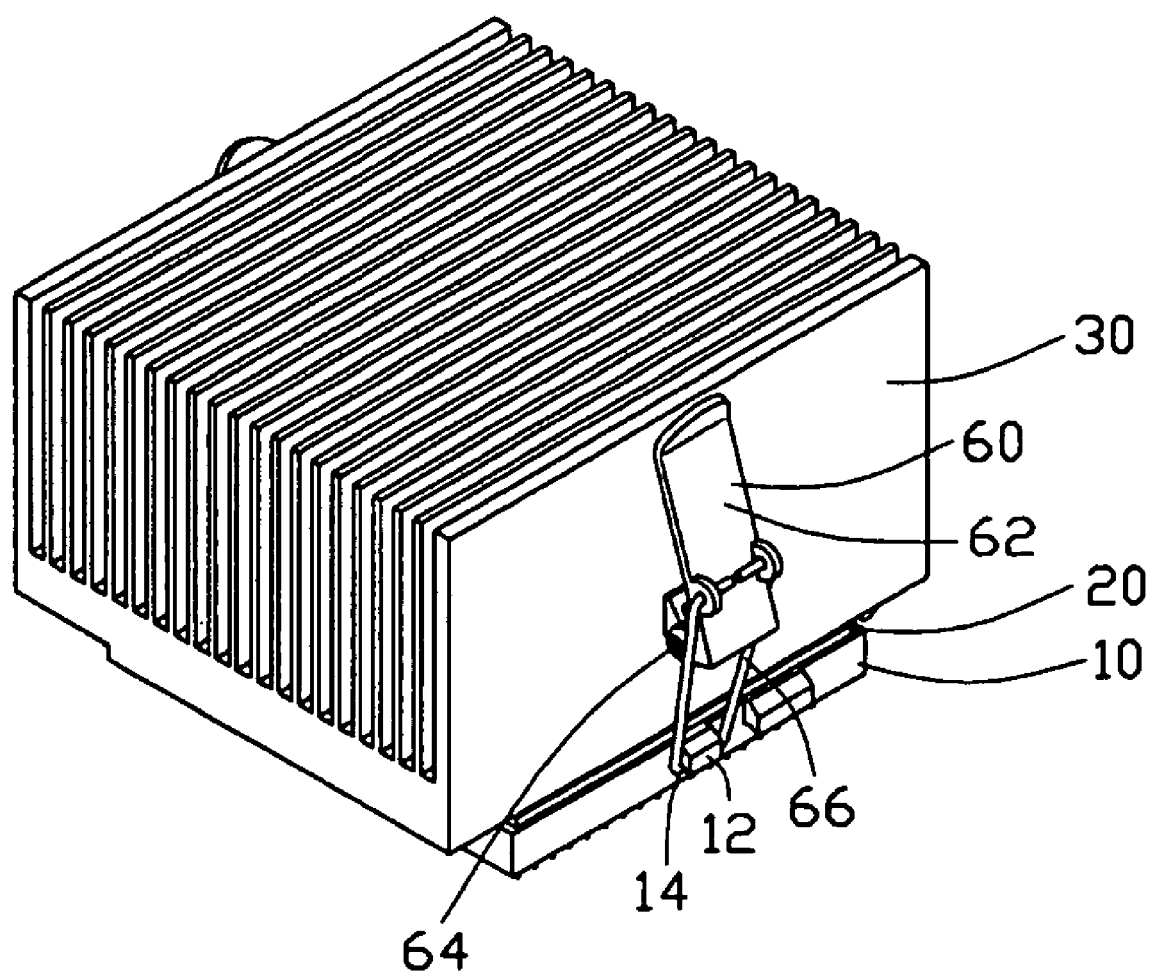
FIG. 3 is an assembled view of FIG. 1.

Referring to FIGS. 2–3, in assembly, the clips 60 are first attached to opposite sides of the heat sink 30 with the shafts 64 received in the pivot slots 40 of the heat sink 30 respectively (see FIG. 2). The combined heat sink 30 and clips 60 is then placed on the electronic component 20. The handles 62 are pivoted upwardly about the shafts 64 by operation on the operating portions 76 until the closed ends of the locking rings 66 are firmly engaged with the concave bottom surfaces 14 of the locking blocks 12. The heat sink 30 is thus firmly attached to the socket 10 by the clips 60.

In disassembly, the handles 62 of the clips 60 are pivoted downwardly about the shafts 64. The rings 66 are consequently moved downwardly to free from the respective locking blocks 12 of the socket 10. The heat sink 30 is therefore disengaged from the socket 10.

In the present invention, it is convenient to operate the handles 62 without using of tools. Furthermore, the clips 60 do not extend through any of fins 34 of the heat sink 30. Because the fins 34 are unaltered, they provide a maximum possible heat dissipating area for the heat sink 30.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipating device assembly comprising:
an electronic device providing a pair of locking means on opposite sides thereof;
a heat sink attached on the electronic device, the heat sink comprising a plurality of fins having a pair of outmost fins on opposite sides of the heat sink, each outmost fin having a protrusion extending therefrom; and
a pair of clips pivotably attached to the heat sink for securing the heat sink to the electronic device, each clip comprising a handle pivotably connected to a corresponding protrusion of an outmost fin and a ring connected to the handle, wherein
the handle of each clip is pivotable about the corresponding outmost fin between a first position at which the ring is engaged with the locking means and a second position at which the ring is disengaged from the locking means.

2. The heat dissipating device assembly as claimed in claim 1, wherein each protrusion defines a slot therein, and the clip provides a shaft received in the slot for pivotably attaching the clip to the heat sink.

3. The heat dissipating device assembly as claimed in claim 2, wherein the protrusion further defines a guiding entrance above and in communication with the slot for facilitating the pivot to enter the slot.

4. The heat dissipating device assembly as claimed in claim 2, wherein the handle comprises a pair of first tabs inwardly formed at one end portion thereof, and the pivot is connected between the first tabs.

5. The heat dissipating device assembly as claimed in claim 4, wherein the first tabs defines a pair of coaxial holes and the pivot is rotatably and detachably received in the holes.

6. The heat dissipating device assembly as claimed in claim 4, wherein the handle further comprises a pair of second tabs outwardly formed therefrom adjacent to the first tabs, the second tabs define a pair of coaxial holes, and the ring comprises a pair of pivot portions extending through the holes respectively.

7. The heat dissipating device assembly as claimed in claim 6, wherein the ring has an approximate rectangular shape and comprises an opening end at which the pivot portions are formed and a closed end opposing the opening end and engaging with the locking means when the handle is located at the second position.

8. The heat dissipating device assembly as claimed in claim 7, wherein the ring is made by bending a wire.

9. The heat dissipating device assembly as claimed in claim 1, wherein the electronic device comprises a socket and an electronic component mounted on the socket.

10. The heat dissipating device assembly as claimed in claim 9, wherein the locking means is a locking block having a concave bottom surface.

11. A heat dissipating device assembly comprising:
an electronic device subassembly providing a pair of locking means on opposite sides thereof;
a heat sink arranged on the electronic device subassembly, comprising a plurality of fins; and
a pair of clips located on opposite outmost fins of the heat sink for securing the heat sink to the electronic device, each clip comprising a handle moveably located on each outmost fin of the heat sink for connecting the handle to the heat sink, and latching means pivotably attached to an opposite side of the handle for engaging with the electronic device subassembly, wherein
the handle of each clip is pivotable about the heat sink between a first position at which the latching means is engaged with the locking means and a second position at which the latching means is disengaged from the locking means.

12. The assembly as claimed in claim 11, wherein said handle defines a pivotal shaft and the heat sink defines an upward guiding entrance to allow said pivotal shaft to downwardly pass therethrough until reaching a final position during assembling and also upwardly pass therethrough to fully remove the clip from the heat sink during disassembling.

13. The assembly as claimed in claim 11, wherein a pair of protrusions extends from opposite outmost fins of the heat sink respectively, and the pair of clips is pivotably mounted to the protrusions respectively.

* * * * *